United States Patent [19]

Silberberg

[11] 3,968,491

[45] July 6, 1976

[54] RADAR RANGEMETER

[75] Inventor: Jeffrey L. Silberberg, Baltimore, Md.

[73] Assignee: The United States of America as represented by the Secretary of the Navy, Washington, D.C.

[22] Filed: Nov. 25, 1974

[21] Appl. No.: 526,998

[52] U.S. Cl. .............................. 343/12 R; 343/13 R
[51] Int. Cl.² ........................... G01S 9/04; G01S 9/06
[58] Field of Search .......................... 343/13 R, 12 R

[56] References Cited
UNITED STATES PATENTS

| | | |
|---|---|---|
| 2,941,151 | 6/1960 | Goldbohm et al. ................ 343/13 R |
| 3,117,317 | 1/1964 | Kenyon ............................... 343/13 R |
| 3,199,104 | 8/1965 | Miller.................................. 343/12 R |
| 3,539,978 | 11/1970 | Stedtnitz ............................. 343/13 R |
| 3,545,861 | 12/1970 | Farnsworth et al. ............... 343/13 R |
| 3,555,549 | 1/1971 | Watkins et al. ..................... 343/13 R |

Primary Examiner—Maynard R. Wilbur
Assistant Examiner—Richard E. Berger
Attorney, Agent, or Firm—R. S. Sciascia; Philip Schneider; Norman Brown

[57] ABSTRACT

A range-determining circuit which counts the time from the transmission of a detection-signal to its echo return, in units corresponding directly to the distance that the detection signal travels.

3 Claims, 2 Drawing Figures

RADAR RANGEMETER

BACKGROUND OF THE INVENTION

The present invention relates to ranging systems and more particularly to radar and similar type ranging systems which determine and indicate target distance.

Radar and similar type ranging systems generally determine the range of a target by either direct calculation or through operator measurement of displayed signals. The direct calculation approach involves measurement of the time from signal transmission to echo return, and the multiplication of that time by the speed of propagation of the radar signal. The range of the target is then equal to one-half the product. The measurement technique is generally utilized in conjunction with radar systems displaying the return echo signal on a screen in a manner so that a mechanical or electrical cursor may be used to measure the distance on the display of the target from some display reference point. The cursor (e.g. indexed ruler) generally converts the measured distance by a scale factor so as to read actual distance.

Determination of target distance by either of the above procedures, although widely used, involves unnecessary calculation usually implemented by additional circuitry. The circuits associated with these additional calculations increase the chance of error and inaccuracy and reduce the rangemeter reliability. The display operator is a constant source of potential error, as well as a limitation upon the rapidity with which measurements of target range may be made.

The present invention determines the radar range of targets by a simple technique without resort to intermediate calculations inherent in prior art devices.

SUMMARY OF THE INVENTION

The present invention directly determines the range of a target by counting the time from signal transmission to receipt of the return echo in units corresponding to predetermined distance units.

A clock operates at a frequency equal to the velocity of propagation of the detection signal divided by twice the smallest range-resolution cell distance desired to be displayed so as to produce signals at time intervals each corresponding to the round trip distance (from transmitter to target and back) of a detection signal.

It is therefore an object of the present invention to determine the range of a target or a radar or sonar type system by counting the time from a transmitted signal to the received echo in intervals corresponding directly to the distance of the target.

It is a further object of the present invention to determine the range of a radar or sonar target without resort to intermediate calculation or scale measurement.

Other objects, advantages and novel features of the invention will become apparent from the following detailed description of the invention when considered in conjunction with the accompanying drawings wherein:

DETAILED DESCRIPTION OF THE INVENTION

Figure 1:
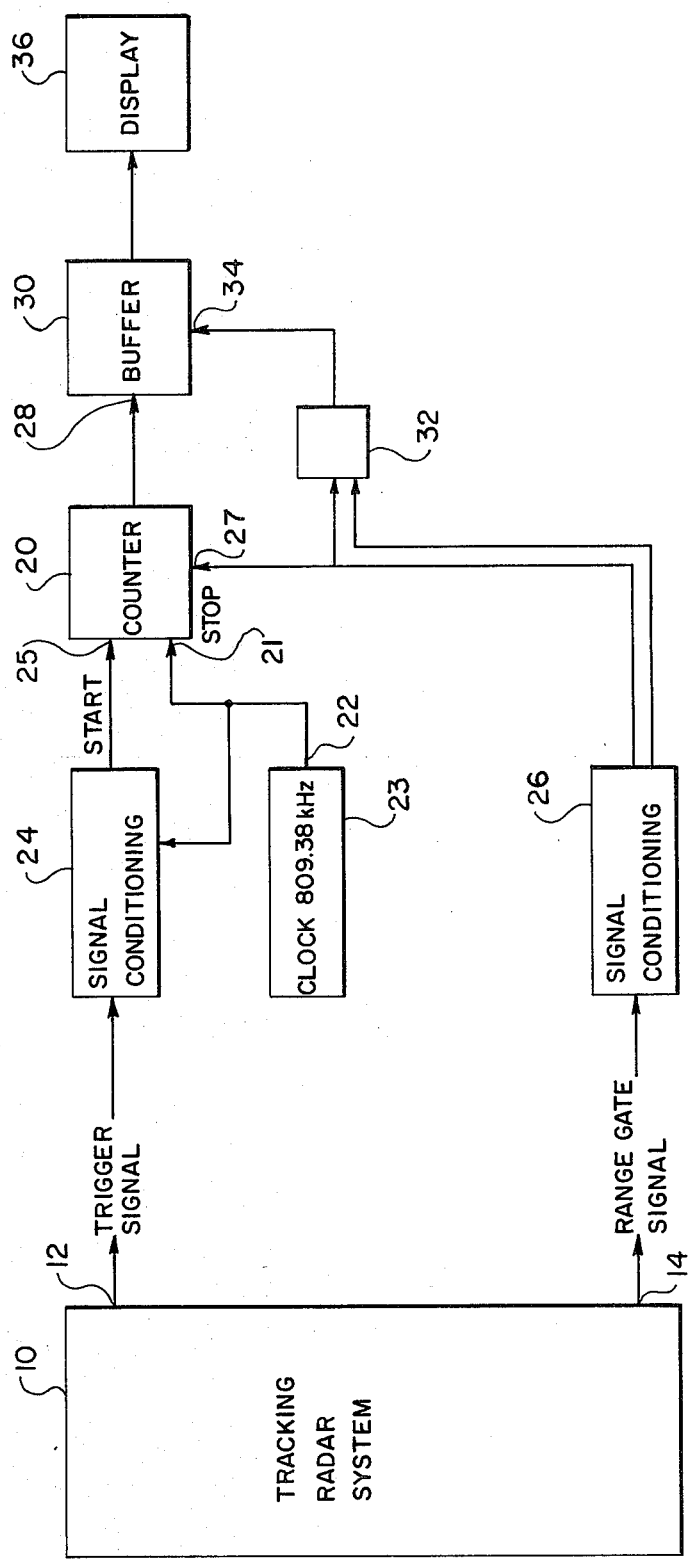
FIG. 1 is a functional-block diagram of an embodiment of the present invention.

FIG. 1 shows generally an embodiment of the present invention adapted to receive a trigger signal and range gate signal from a conventional tracking radar system 10 having a trigger signal output terminal 12 and a range gate signal output terminal 14. trigger signal terminal 12 is connected through a first signal conditioning means 24 to a start-clear terminal 25 of counter 20. The range-gate signal terminal 14 is connected through a second signal conditioning means 26 to a stop-input terminal 27 of counter 20.

The output of counter 20 is connected to a data input terminal 28 of a buffer device 30. A load-control circuit 32 is connected between the output of signal conditioning means 26 and a load-enable input terminal 34 of buffer 30. The output of buffer 30 is connected to a digital display device 36.

Figure 2:
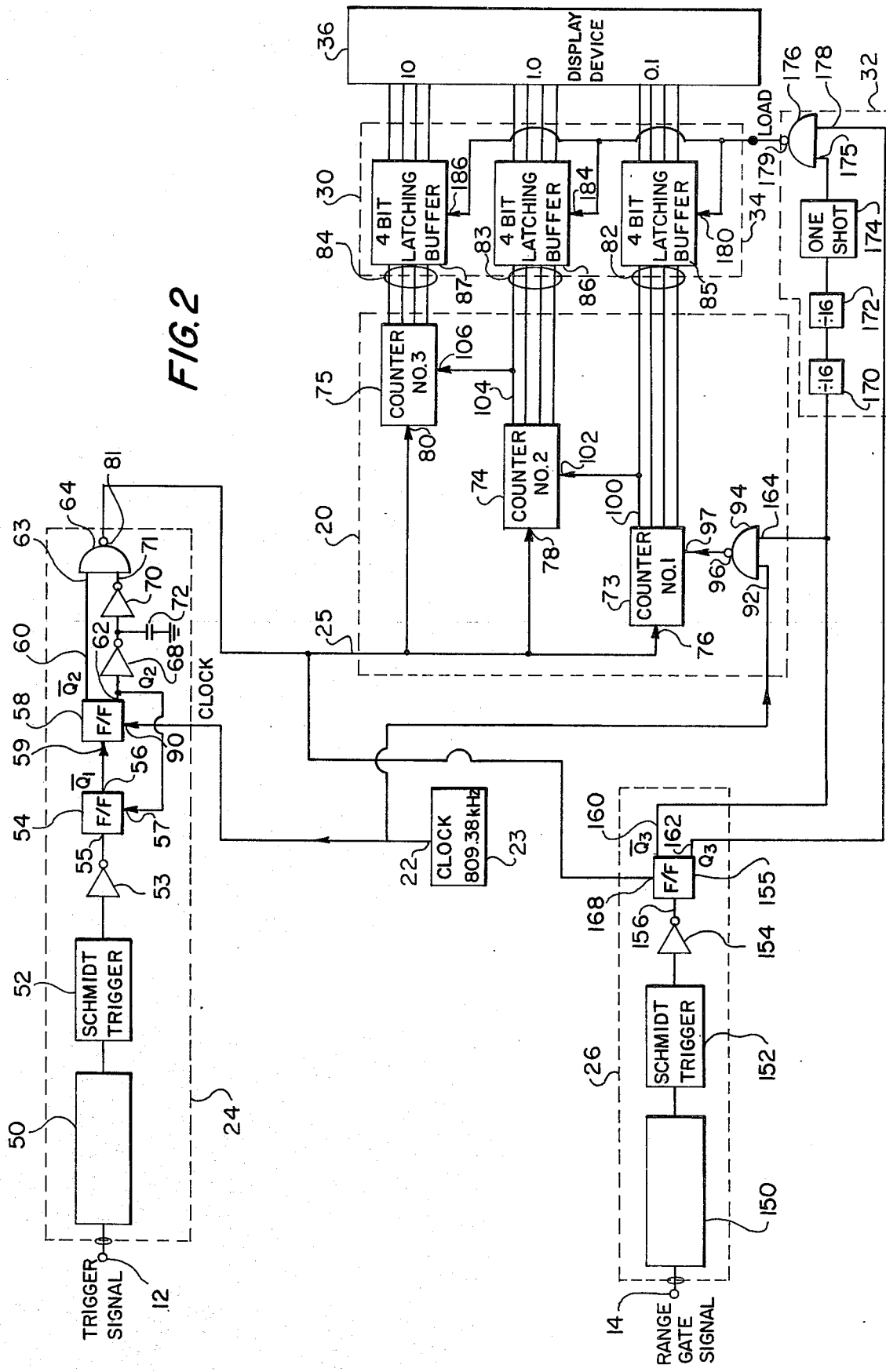
FIG. 2 is a schematic block diagram of the embodiment of the present invention depicted in FIG. 1.

FIG. 2 depicts in more detail the functional elements of the embodiment of the present invention depicted in FIG. 1, and shows more schematically construction of selected elements and the interrelationship between elements.

The first signal conditioner 24 is comprised of a high input impedance section 50, a Schmidt trigger device 52, an inverting amplifier 53 and a flip-flop device 54 connected in the order recited. Flip-flop 54 is arranged to act as a bistable device having an input terminal 55 and an output terminal 56 for a signal $\bar{Q}_1$. Flip-flop 54 also has a reset terminal 57. A second flip-flop device 58 has an input terminal 59 and output terminals 60 and 62 for signals $\bar{Q}_2$ and $Q_2$ respectively. The $Q_2$ output terminal 62 is connected to reset terminal 57. The $\bar{Q}_2$ output terminal 60 is connected to a first input 63 of a NAND device 64. Output terminal 62 is also connected to an inverting amplifier 68. The inverting amplifier 68 is connected in series with a second inverting amplifier 70 whose output terminal is connected to a second input terminal 71 of NAND device 64. A capacitor 72 is connected between ground and a point between the first and second inverting amplifiers 68, 70.

Counter device 20 is comprised of first, second, and third conventional digital counters 73, 74, 75 each having a four-bit parallel digital output line. These counters 73, 74, 75 have respective reset terminals 76, 78, 80 each of which are connected to the output terminal 81 of NAND device 64.

The digital outputs from respective counters 73, 74, 75 are connected to corresponding input terminals 82, 83, 84 of three corresponding four-bit latching buffer devices 85, 86, 87. The three buffer devices 85, 86, 87 form the buffer 30. The output of these latching buffer devices 85, 86, 87 are connected to corresponding input terminals of display device 36. Display device 36 is adapted to present in visual form the digital representation of the parallel binary coded decimal signals received at its input terminals.

The digital clock 22 operates at a frequency of 809.38 k Hz. The clock output terminal 22 is connected to a clock gate terminal 90 of second flip-flop 58, and also to a first input terminal 92 of a NAND device 94. The NAND device 94 has an output terminal 96 connected to a clock input terminal 97 of first counter 73. The highest order digital line 100 of the first counter 73 is connected to a clock input terminal 102 of the second counter 74. In a similar fashion, the highest order digital line 104 of second counter 74 is connected to a clock input terminal 106 of the third counter 75.

The second conditioning means 26 is comprised of a high input impedance conditioner 150, a Schmidt trigger device 152, an inverting amplifier 154, and a flip-flop device 155, each connected in the order recited. Flip-flop 155 has an input terminal 156, a first output terminal 160 for a signal $\overline{Q}_3$, and a second output terminal 162 for a signal $Q_3$. First output terminal 160 is connected to a second input terminal 164 of NAND device 94. Flip-flop device 155 has a reset terminal 168 connected to the output terminal 81 of NAND device 64.

The load-control device 32 is comprised of two divide-by-16 dividers 170, 172 connected in series with a one-shot multivibrator 174. The output terminal of the multivibrator device 174 is connected to a first input terminal 175 of a NAND device 176. The second input terminal 178 of NAND device 176 is connected to the $Q_3$ output terminal 162. The output terminal 179 of NAND device 176 is connected to respective load-enable terminals 180, 184, 186 of latching buffers 85, 86, 87.

In operation, the transmission of a radar signal causes the tracking radar system 10 to generate a trigger signal pulse. This trigger signal is then applied to the impedance conditioner 50. Conditioner 50 forms a high input impedance and provides for adjustment of sensitivity to various levels of trigger signal to allow use of the present invention with various radar systems 10. The Schmidt trigger device 52 then "squares up" the trigger signal pulse. Inverting amplifier 54 then amplifies and inverts the squared up trigger signal and applies it to the input terminal 55 of the flip-flop 54, causing output signal $\overline{Q}_1$ to change from a "high" level (i.e. 5 volts) to "low" level (i.e. 0.4 volts). The low $\overline{Q}_1$ signal, applied at the input terminal 59 of the second flip-flop 58 enables the state of the output signals $Q_2$, $\overline{Q}_2$ to reverse on the next positive transition of the clock, resulting in the signal $\overline{Q}_2$ changing to high and $Q_2$ to low. The low $Q_2$ signal is applied to the reset terminal 57 causing the output signal $\overline{Q}_1$ to revert back to high. The high $\overline{Q}_2$ signal is applied to the first input of NAND device 64.

Before the above described change in the output signals $Q_2$ and $\overline{Q}_2$, $Q_2$ is high. The high $Q_2$ signal is inverted (to low) by inverting amplifier 68, and the capacitor 72 was accordingly charged to a low value. Inverting amplifier 70 then inverted this low signal voltage (at capacitor 72) so as to apply a high signal to the second input terminal 71 of NAND device 64. Upon the reversal of the state of output signals $Q_2$, $\overline{Q}_2$ (resulting in $Q_2$ changing to low), inverting amplifier 68 applies a high signal $Q_2$ to capacitor 72, which then begins to charge toward the new high value (taking approximately 600 nS to charge). During the initial portion (e.g. 90 nS) of the charging period, the voltage at the capacitor 72 is considered to be low, and thus the input signal to the second input terminal 71 during this initial period is considered high. Since during this brief initial period both inputs to NAND device 64 are high, the output of NAND device 64 is low. This low output signal applied to respective reset terminals 76, 78, 80 of first, second, and third counters 73, 74, 75 causes each counter to be reset. Also, the output signal of NAND device 64 received at the reset terminal 168 causes the flip-flop 156 to reset (so as to have its output signal $\overline{Q}_3$ high and signal $Q_3$ low).

Clock 23 is operated at a frequency of 809.38 k Hz. This frequency results in clock timing pulses (each of approximately 0.618 microseconds in duration) being produced every 1.236 microseconds. Each clock pulse applied to the NAND first input terminal 92 passes through NAND device 94 (when enabled) to the clock input terminal 97 of the first counter 73. The first counter 73 counts each clock pulse and stores the number of such pulses in binary coded decimal format. Each subsequent clock pulse causes the first counter 73 to change its output so as to provide a binary coded decimal representation of the total number of pulses counted. Since the first counter 73 has a four-bit parallel digital output line, its maximum accumulating capacity is the binary number 9. When the next subsequent is reached, the signal present on the highest order digital line 100 changes to zero. The negative going transition associated with this change causes counter 74 to increment.

Corresponding latching buffers 180, 184, 186 store (upon command of an enable signal at respective enable terminals 180, 184, 186) the binary coded decimal outputs from respective counters 73, 74, 75. These outputs are then coupled to the display device 36, which converts the binary coded decimal format to a digital display format.

Upon occurence of the target return signal, the range-gate signal from tracking radar 10 is applied to the impedance conditioner 150. Impedance conditioneer 150 forms a high input impedance and provides for adjustment of sensitivity to various levels of range-gate signal to allow use of the present invention with various radar systems 10. The signal from conditioner 150 is then applied to the Schmidt trigger device 152, which squares up the range-gate signal pulse. Inverting amplifier 154 then inverts the squared up range-gate signal pulse and applies it to the input terminal 156 of flip-flop 155. This pulse causes the state of output signals $Q_3$, $\overline{Q}_3$ to reverse, resulting in signal $Q_3$ becoming high and $\overline{Q}_3$ becoming low. When the signal $\overline{Q}_3$ becomes low, it acts to disenable the NAND device 94, thereby stopping counter 20 (by preventing any subsequent clock pulses from passing through NAND device 94).

The $\overline{Q}_3$ signal is passed through the two divide-by-16 devices 170, 172. The output signal of the second divider 172 will then be a square wave those period is 256 times that of the input signal pulses to divider 170. A high-to-low transition of the output signal of divider 172 causes the one-shot device 174 to generate a 1.5 micro-second high output pulse. This output pulse (from one-shot device 174) appears once for every 256 $\overline{Q}_3$ pulses. The high $Q_3$ signal enables the NAND 176.

Upon the joint occurence of the high $Q_3$ signal and an output pulse from one shot device 174, the output signal of NAND 176 goes low. This low output signal (from NAND 176) causes buffer 30 to load the digital signal output from the first, second, and third respective counters 73, 74, 75. By resort to this procedure, the display is changed about 4 times a second when utilized in conjunction with a tracking radar system operating at a repetition-frequency of 1000 per second.

The display 30 is thus seen to display directly in digital form, and without intermediate calculation, the range or distance of a target from a transmitter-receiver.

It should be noted that although the present invention has been described in terms of a radar (electromagnetic energy) system, it may readily be employed in non-electromagnetic type detection systems as well.

Obviously many modifications and variations of the present invention are possible in light of the above teachings. It is therefore to be understood that within the scope of the appended claims the invention may be practiced otherwise than as specifically described.

What is claimed and desired to be secured by Letters Patent of the United States is:

1. A range determining and display circuit for use with reflected energy ranging systems producing a first signal upon the occurence of transmission of a detection signal and a second signal upon the return target reflection comprising:

first conditioning means for receiving said first signal;

second conditioning means for receiving said second signal;

digital clock means for generating timing signals spaced apart in time at intervals corresponding to the propagation time necessary for said detection signal to travel twice the distance of the lowest discrete range distance to be displayed, said timing signals being coupled to said first conditioning means as an input;

digital counting means for counting said timing signals, having a first input terminal connected to the output of said first conditioning means, a second input terminal connected to the output of said second conditioning means, and a clock input terminal connected to the output of said digital clock means;

buffer means connected to the output of said clock means for storing a selected output signal from said counting means; and digital display means connected to the output of said buffer means for displaying in numerical format the corresponding decimal value of said stored selected counting means output signal stored in said buffer means;

whereby said first signal enables said counting means to begin counting said timing signals, and said second signal dis-enables said counting means thereby causing the range of said target to be displayed directly in digital numerical format.

2. The range determining and display circuit of claim 1 wherein said buffer means includes division means connected to the output of said second signal conditioning means, said division means for generating a load enable signal upon the occurence of a predetermined number of said second signals whereby said buffer means stores the output signal of said digital counter means upon receiving said load enable signal.

3. The range determining and display circuit of claim 1 wherein said digital clock means operates at a frequency of 809.38 k Hz.

* * * * *